United States Patent [19]

Masanao

[11] Patent Number: 4,903,593
[45] Date of Patent: Feb. 27, 1990

[54] APPARATUS FOR SCREEN LENGTH AND SNAP-OFF ANGLE CONTROL

[76] Inventor: Oozeki Masanao, 47-301 Sakuradai 3-chome, Nerima-ku, Tokyo, Japan, 176

[21] Appl. No.: 320,968

[22] Filed: Mar. 9, 1989

Related U.S. Application Data

[62] Division of Ser. No. 76,300, Jul. 22, 1987, Pat. No. 4,858,527.

[51] Int. Cl.$^4$ .............................................. B41F 15/42
[52] U.S. Cl. ................................................... 101/123
[58] Field of Search .............................. 101/123, 126

[56] References Cited

U.S. PATENT DOCUMENTS 4,193,344 3/1980 Ericsson ............................. 101/126

Primary Examiner—Clifford D. Crowder
Attorney, Agent, or Firm—Burgess, Ryan and Wayne

[57] ABSTRACT

An improved screen printing machine includes a screen held over a surface to be printed, a squeegee, a drive assembly which moves at least one end of the screen along a locus that enables substantially uniform maintenance of the length of the screen as well as the snap-off angle formed between the screen and the plane of the surface on the side of the squeegee opposite to where the squeegee carries its inking edge at the lower end thereof so as to provide substantially no dimensional deviation from the original and with enhanced uniformity in the thickness of the ink that is transferred.

6 Claims, 5 Drawing Sheets

APPARATUS FOR SCREEN LENGTH AND SNAP-OFF ANGLE CONTROL

This is a division, of application Ser. No. 076,300, filed July 22, 1987, now U.S. Pat. No. 4,858,527.

BACKGROUND OF THE INVENTION

1. Field of the Invention

The present invention relates to an improved screen printing machine.

2. Description of the Prior Art

In screen printing a screen made of fine-meshed textile is stretched in taut condition, clamped along all sides, in a frame of shallow box-like build, and a pattern of resist is coated, either manually or optochemically, in the screen. The screen is placed on top of the surface to be printed and ink is applied to the upper face of the screen by means of a squeegee. Thus, pressure applied by the squeegee to the resist-coated screen face causes some of the ink to soak through its pervious or non-coated areas so that a pattern of ink is printed in the surface below. A typical screen printing machine is shown in FIG. 1.

Screen printing machines operate with a variety of inks and reproduce the image or pattern in a relatively thick layer of ink so that the resultant print can be highly resistant to chemicals and have enhanced weatherproof properties. Mainly because of these advantages, screen printing in recent years has come to be used in the production of circuit patterns in integrated circuit (IC) boards.

If the squeegee is moved in the face of the screen, with minimum pressure enough to keep the inking tip of the squeegee in uniform contact with the screen but just short of causing any tension in the screen, the locus described by the squeegee tip is in theory a definite segment of an ellipse cut at both ends by the distance traveled by the squeegee (as depicted by dotted line in FIG. 2). The locus is also a path that is followed by the moving botton P of the screen where it is caused to slightly elastically bend down under the foregoing minimum pressure in the squeegee. To make the print in actual practice of screen printing, however, the squeegee has to be moved with some required measure of pressure for ink transfer, naturally greater than the above minimum pressure, so that the underside of the screen is brought into close contact with the surface to be printed, all the way from end to end. This means that the moving bottom P of the screen follows a linear path, not a curve similar to the dotted line in FIG. 2, since the surface to be printed is generally flat and evenly spaced from the horizontal plane of the screen. Thus, with the movement of the squeegee, the screen is subjected to a varying degree of tension depending on its relative location. In more detail, where the screen is away from its middle in the direction of travel of the squeegee, the tension becomes increasingly greater since the screen must sag far down beyond the theoretical curve (dotted line in FIG. 2) at both ends thereof. As a consequence, the screen has greater holes in the mesh at both ends than in the middle, so that more ink gets through there. Thus, the resultant printed pattern or image is likely to have a local distortion or dimensional deviation from the original pattern of the resist. This is a problem with most conventional screen printing machines.

The prior art also has other printing problems. In actual operation, the squeegee is normally moved at a constant angle with respect to the plane of the surface to be printed, with its inking tip being pressed against the surface over the screen. Thus, as shown in FIG. 2, the screen sags at point P where the bottom side of the screen 3 forms angles $\alpha$ and $\beta$ with respect to the plane of the surface 4. Angle $\beta$ is the angle formed on the side of the squeegee where it carries an inking edge at its lower tip. The opposite angle $\alpha$ is generally known as the snap-off angle. Because of the designs of those prior art devices, squeegee movement along the effective screen length results in a change in the snap-off and opposite angles $\alpha$ and $\beta$, as illustrated in FIG. 2 showing that the snap-off angle $\alpha$ gets larger as the squeegee moves from P1 to P2. This angular change brings the screen 3 to contact the surface 4 without uniformity, with a resultant uneven transfer of ink. Thus, the resultant reproduced print has tended to occur in a varying degree of ink thickness.

Therefore, in order to accomplish faithful pattern reproduction in screen printing, it is necessary to maintain not only the snap-off angle but also the tension in the screen under the pressure of the moving squeege uniform or nearly uniform.

To keep a uniform tension in the screen during the movement of the squeege is to maintain the length of the screen constant.

In addition, what is more ideal from the viewpoint of practical operation is to maintain the foregoing angle $\beta$ uniform, along with the snap-off angle.

SUMMARY OF THE INVENTION

The present invention has been proposed to eliminate the above-mentioned problems.

It is therefore a main object of the present invention to provide an improved screen printing machine in which not only the snap-off angle but also the screen length can be maintained constant or nearly constant throughout the overall movement of the squeegee, according to a preferred embodiment of the invention.

Furthermore, in accordance with another embodiment of the invention, both of the snap-off angle and opposite angle can be maintained uniform or nearly uniform, along with the screen length.

It is another object of the present invention to provide an improved screen printing machine in which, owing to the above features, reproduced patterns or images are in a substantially uniform layer of ink, without a dimensional deviation or distortion from the original in the resist.

BRIEF EXPLANATION OF THE ACCOMPANYING DRAWINGS

Figure 5A:
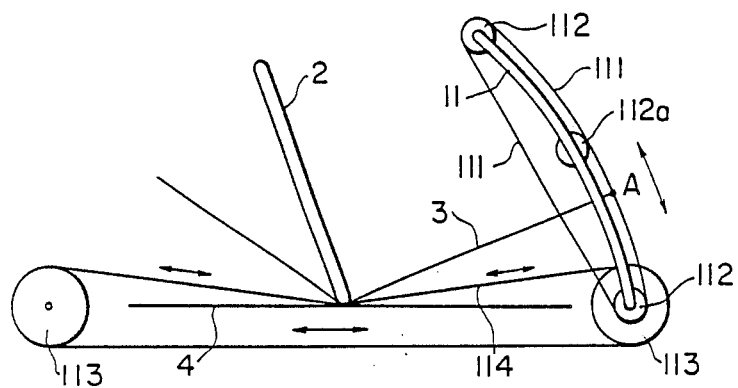
Figure 5B:
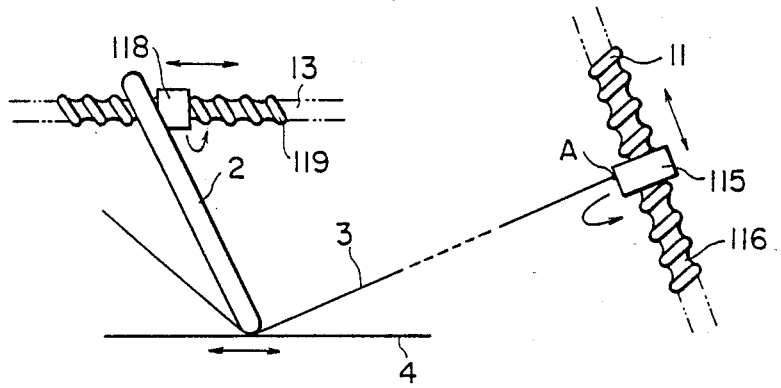
Figure 5C:
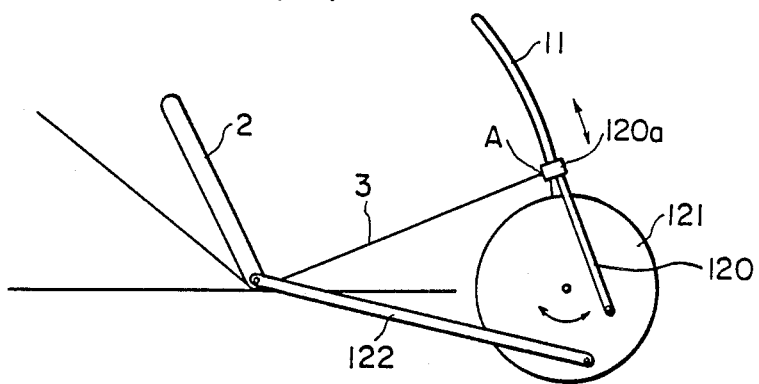
Figure 6A:
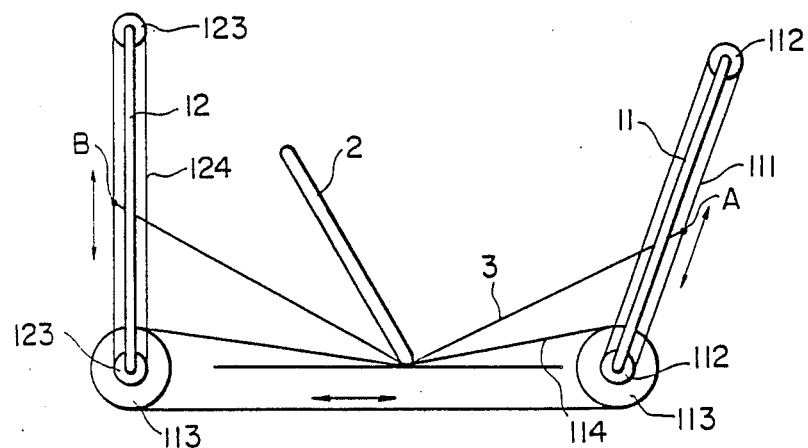
Figure 6B:
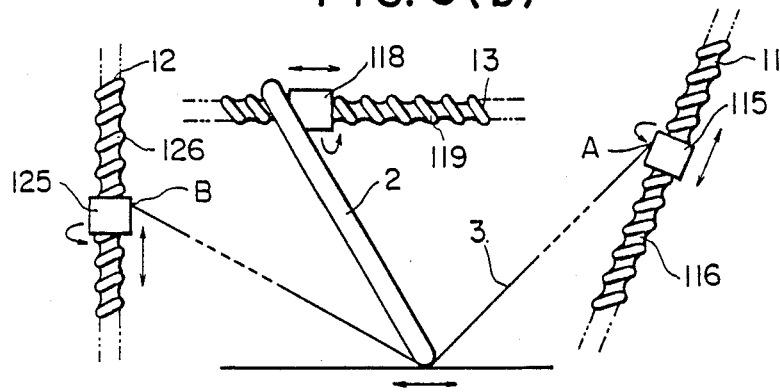
Figure 6C:
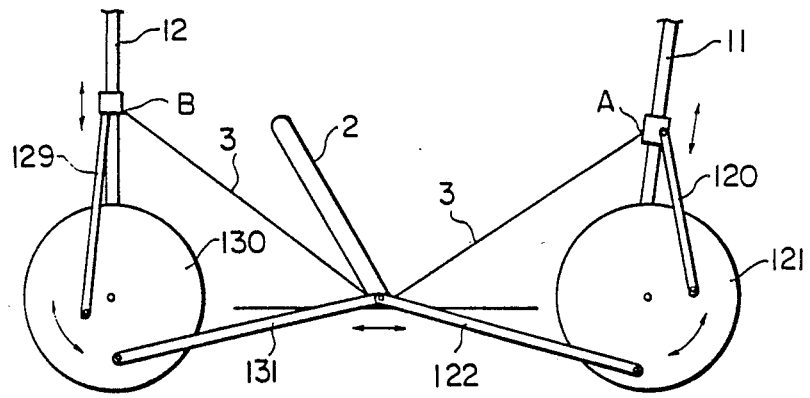

FIGS. 5(a), 5(b) and 5(c) are respectively views of different modifications of the first embodiment in which the movement of the squeegee is synchronized with the movable screen holder to which the screen is connected at its one end by different drive systems such as a pulley and belt, a worm gearing, and a crank mechanism; and FIGS. 6(a), 6(b) and 6(c) are respectively views showing different modified forms of the second embodiment in which the movement of the squeegee is synchronized with the separate movable screen holders to which the screen has its both ends connected by different drive systems such as a pulley and belt, a worm gearing, and a crank mechanism.

DETAILED DESCRIPTION OF THE INVENTION

Figure 3A:
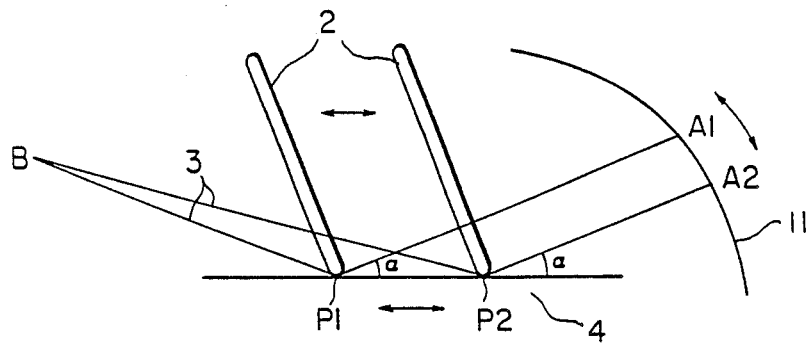
FIG. 3(a) is a schematic side view of a first preferred embodiment of the present invention, showing the principles of its arrangement in which both the snap-off angle $\alpha$ and the length of the screen can be maintained constant or nearly constant by means of a movable screen holder connected to one end of the screen.

The screen printing machine according to a first preferred embodiment of the present invention comprises a movable screen holder 11, as schematically shown in FIG. 3(a), to which one end of a screen 3 is connected in such a manner that the holder follows the linear movement of a squeegee 2 along the length of a surface 4 to be printed, with the screen causing no or nearly no dimensional change in its length, thereby maintaining the snap-off angle uniform or nearly uniform at every point P at which the squeegee brings the screen into contact with the surface 4 for ink transfer. The snap-off angle $\alpha$ is defined as the angle formed by the underside of the screen 3 with respect to the horizontal plane of the surface 4 on the side opposite to where the squeegee 2 has an inking edge at its lower tip.

In more detail, when the squeegee 2 in operation is moved from P1 to P2 in contact with the surface 4 over the screen 3, the screen holder 11 makes a corresponding distance of move from A1 to A2. Thus, the snap-off angle and the screen length can be kept substantially constant throughout the entire length the squeegee moves.

Figure 3B:
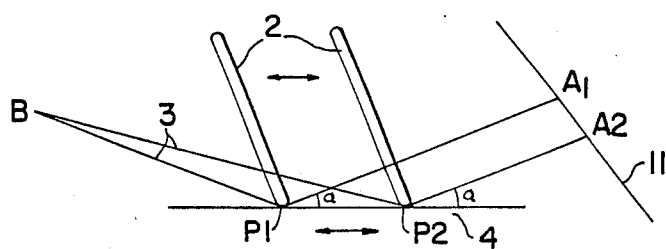
FIG. 3(b) is a schematic side view of a modified form of the first embodiment in which both the snap-off angle and the screen length can be kept nearly uniform by means of a linearly movable screen holder connected to one end of the screen.
Figure 3C:
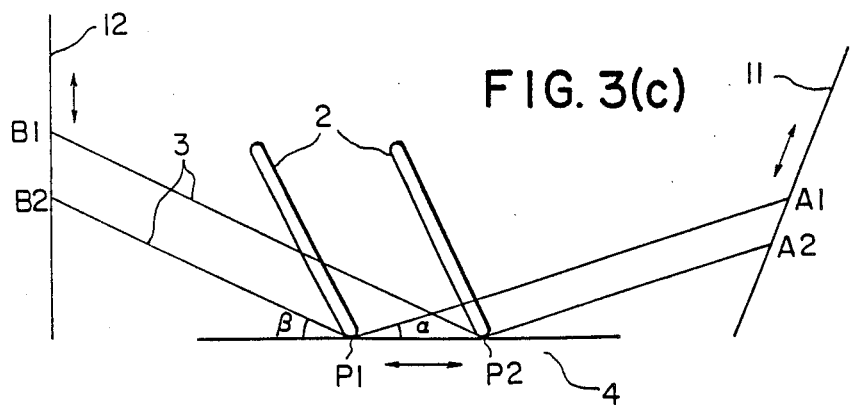
FIG. 3(c) is a schematic side view of a second preferred embodiment of the present invention in which, not only the snap-off angle and the screen length, but also the opposite angle, the angle formed between the screen and surface to be printed on the inking edge side of the squeegee, can be maintained uniform or nearly uniform.

The screen printing machine in accordance with another preferred embodiment of the present invention comprises a pair of movably disposed screen holders 11 and 12, as diagrammatically illustrated in FIG. 3(c), to which both ends of a screen 3 are connected in a similar manner to the first embodiment above that each of the holders shifts following the linear movement of a squeegee 2 along the length of a surface 4 to be printed, likewise with the screen 3 causing no or nearly no dimensional change in its length, thereby maintaining the snap-off and opposite angles $\alpha$ and $\beta$ uniform or almost uniform at every point P at which the squeegee presses the screen into contact with the surface 4 for ink transfer. The opposite angle $\beta$ is the angle defined by the screen 3 relative to the horizontal plane of the surface 4 on the inking-edge side of the squeegee 2.

In more detail, when the squeegee 2 in operation moves from P1 to P2, each of the screen holders 11 and 12 shifts a corresponding distance from A1 to A2 and B1 to B2, respectively. Thus, the snap-off and opposite angles $\alpha$ and $\beta$ as well as the screen length can be kept substantially uniform throughout the entire length of the surface 4.

Figure 1:
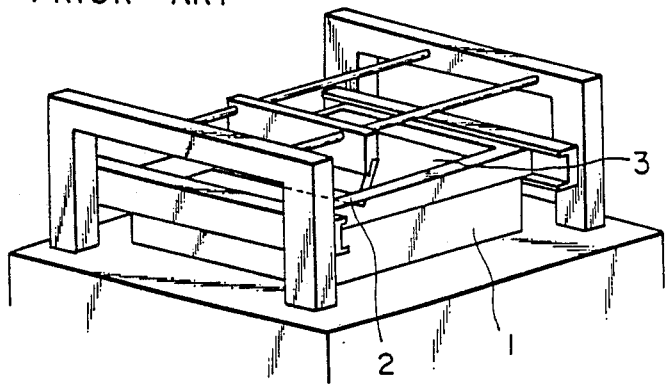
FIG. 1 is a schematic perspective view of a typical screen printing machine.
Figure 2:
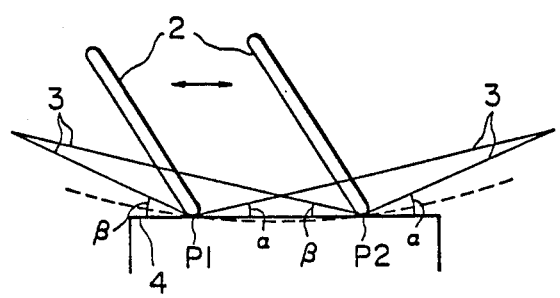
FIG. 2 is a schematic side view of a screen printing machine, with the squeegee depicted as seen perpendicularly to the direction of movement, in which the dotted line represents the locus followed by the tip of a squeegee that is moved in even contact with the face of a screen, without causing any dimensional elogation in the screen.

As shown in FIG. 3(a), the device according to the first embodiment has the screen 3 connected at its other end to a fixed screen holder at B. Thus, in either of the embodiments, the frame, designated at 1 in FIG. 1, in which the screen 3 is fixed in position, may eliminate its opposite side plates at both ends thereof where the screen has its ends connected to the respective screen holders.

A study will now be made of the locus described by the movable holder 11 of the first embodiment to enable the snap-off angle to be maintained substantially uniform throughout the entire effective length of the surface to be printed.

Figure 4A:
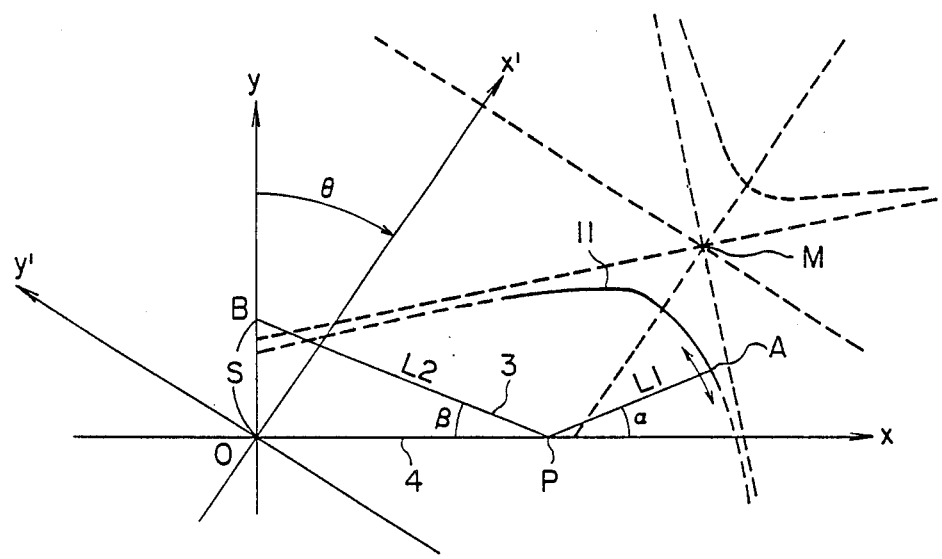
FIG. 4(a) is a diagram plotted to determine the locus followed by the end of a screen that is moved with a movable screen holder connected to that screen end.

Referring to FIG. 4(a), a screen has its one end A connected to a movable holder 11 and its other end B fixed to a stationary holder. The screen 3 is pressed against the surface 4, the plane of which is on the x-axis by the tip P of a linearly moving squeegee, not shown. The angle $\alpha$ is the snap-off angle as explained above. In the figure, the locus followed by the free end A of the screen 3 will be determined to satisfy the condition that the snap-off angle $\alpha$ formed between the screen 3 and surface 4 is constant.

Assuming that the fixed end B of the screen 3 is at (O, S), and L is the axial length of the screen, the following equations follow:

$$L1 + L2 = L,$$

$$\sin\alpha = y/L1,$$

$$\sin\beta = S/L2,$$

$$x = L1\cos\alpha + L2\cos\beta.$$

where L1 is the distance between A and P, and L2 the distance between B and P. Thus, $$(S\sin\alpha)^2 + (x\sin\alpha - y\cos\alpha)^2 = (L\sin\alpha - y)^2$$

Therefore, $$S^2 + x^2 - 2xy\cot\alpha + 2Ly\csc\alpha = L^2 + y^2 \qquad (1)$$

consider coordinates (x', y') obtained by revolving the coordinates (x, y) through $\theta$, then $$x = x'\cos\theta - y'\sin\theta \qquad (2)$$

$$y = y'\cos\theta + x'\sin\theta \qquad (3)$$

Let $\theta$ have a value to satisfy the equation $2\theta - \alpha = \pi/2$ so as to enable the term x'.y' to vanish from (2) and (3), and substitute them in (1) to express it in terms of x' and y', which gives $$\{x' - L\sin(\alpha/2 + \pi/4)\}^2 - \{y' + L\cos(\alpha/2 + \pi/4)\}^2 = S^2 \cdot \sin\alpha.$$

It has been proved from the above mathematical model that the locus followed by the moving end A of the screen 3 is on a hyperbola having its loci at L sin($\alpha/2+\pi/4$)±$\sqrt{2}$ sin$\alpha$.S, −L cos($\alpha/2+\pi/4$), with its asymptotic lines at 45° with respect to L sin($\alpha/2+\pi/4$), −L cos($\alpha/2+\pi/4$), respectively, in the coordinates obtained by revolving the original ones (x, y) in a positive direction through an angle of $\alpha/2+\pi/4$.

It follows that it is possible for the holder 11 connected to the screen end A to take a path, in its movement with the squeegee 2 in contact with the surface 4 at P, that enables the snap-off angle $\alpha$ and the length L of the screen 3 to be kept constant. The locus that the holder 11 takes can substantially be on the above hyperbola drawn in the revolved coordinates.

The locus determined above is purely theoretical and, in actual practice, a holder is likely to deviate more or less from the theoretical locus. Therefore, it is to be understood that the scope of the present invention should encompass all possible paths that approximate the locus determined by using the above mathematical model.

In other words, the present invention is concerned with the method of determining the locus that the moving end of a screen or a holder takes to keep the snap-off angle constant or nearly constant as it is virtually difficult to achieve mathematical precision in practical fields of engineering.

As an alternative means, the locus may be determined by connecting into a smooth curve points plotted by computerized calculation using the above model and equations to show the path largely taken by the holder 11 with the movement of the squeegee 2. The connected curve thus obtained would approximate the above theoretical locus.

Furthermore, one of the simplest ways to determine the locus for practical purposes in accordance with the present invention is to take advantage of the asymptotic lines for the above theoretical locus in FIG. 3(a). That is, it may be arranged so that the holder 11 moves along a straight line that is substantially on the proper one of the asymptotic lines, as shown in FIG. 3(b).

The use of such a straight line will be justified from the practical point, providing the total distance the screen end A or holder 11 has to move is short enough and lies such that still with respect to FIG. 3(a), the hyperbola runs in close proximation with its asymptotic lines. In some successful instances, the holder 11 can take a path that is closely approximating the theoretical hyperbola determined from the mathematical model in FIG. 3(a).

In more detail, referring still to FIG. 4(a), a straight line is considered that is upwardly inwardly inclined at an angle of $\alpha/2$ relative to the vertical to the direction of linear movement of the squeegee 2. This straight line would be parallel to one of the above asymptotic lines and extend in close approximation with the hyperbola determined from the mathematical mode in FIG. 4(a).

In addition, a study will be conducted to determine the locus of each of the movable holders 11 and 12 connected to the opposite ends of the screen 3, respectively, when they move in unison with the squeegee 2, in accordance with the second embodiment of the present invention shown in FIG. 3(c).

Figure 4B:
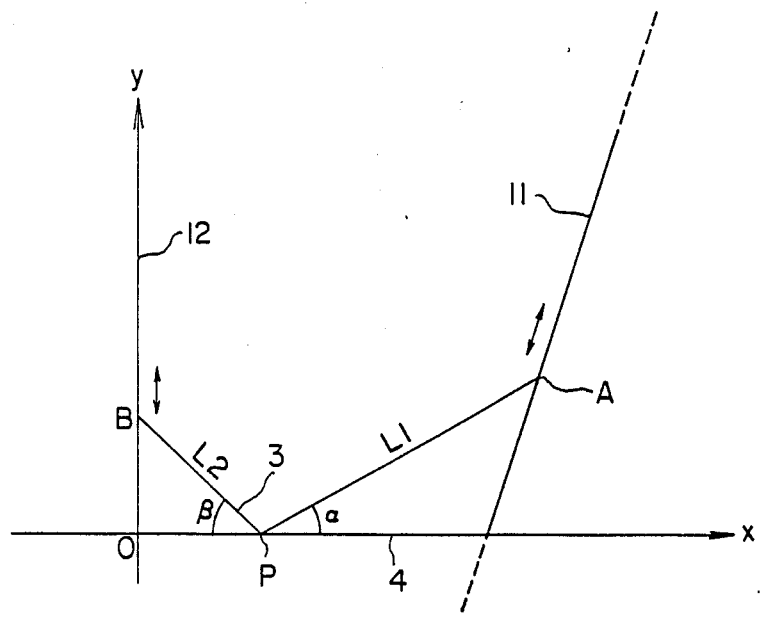
FIG. 4(b) is a diagram plotted to determine the locus determined by each of the ends of a screen that are moved with separate movable screen holders connected to the respective screen ends.

Referring now to FIG. 4(b), let A(x1, y1) and B(x2, y2) denote the loci taken by the opposed ends of the screen 3 having a length L, with the loci being such as to maintain constant not only the screen length L but also the both angles $\alpha$ and $\beta$ formed between the screen 3 and the surface 4 at P where the squeegee, not shown, has its lower end contacted with the surface.

If the location of P in the coordinates of FIG. 4(b) is expressed by (t, O), the following equations follow:

$$x1-t=L1\cos\alpha, \qquad (4)$$

$$t-x2=L2\cos\beta, \qquad (5)$$

$$y1=L1\sin\alpha, \qquad (6)$$

$$y2=L2\sin\beta, \qquad (7)$$

where L1 is the distance between A and P; L2 the distance between B and P.

Therefore, $$L=L1+L2. \qquad (8)$$

Combining (4) and (5), and adjusting to let the terms t vanish, $$x1-x2=y1\cot\alpha+y2\cot\beta. \qquad (9)$$

Substituting (6) and (7) in (8), $$y1\csc\alpha+Y2\csc\beta=L \qquad (10)$$

If A(x1, y1) and B(x2, y2) satisfy (9) and (10) simultaneously, the theoretical locuses determined are such as to maintain the angles $\alpha$ and $\beta$ constant regardless of the position of P.

Determination of the locus that keeps the angle $\alpha$ uniform is substantially the same as described in connection with FIG. 4(a) and will here be omitted for brevity's sake. Thus, the second embodiment should be considered to use the concept of the first embodiment in determining the locus for the angle $\alpha$. The locus taken by B(x2, y2) to maintain the angle $\beta$ constant will be determined.

Assuming that B moves along y-axis, that is, x2=0, the equations (9) and (10) are adjusted for B(x2, y2) as follows:

$$x1\sin\alpha+y1(\cos\beta-\cos\alpha)=L\cos\alpha\cos\beta.$$

(1) if $\alpha\neq\beta$, B(x2, y2) follows a locus that is a straight line with a gradient of $\sin\alpha/(\cos\alpha-\cos\beta)$ intersecting the y-axis at 0 and L $\sin\alpha\cos\beta/(\cos\beta-\cos\alpha)$.

If $\alpha=\beta$, the locus followed by B(x2, y2) is a straight line expressed by x=L $\cos\beta$, extending parallel to and spaced from the y-axis by L $\cos\beta$.

As with the first embodiment, the loci determined above are purely theoretical and moving holders 11 and 12 in actual practice are likely to deviate more or less from their respective theoretical locus. Therefore, it is to be understood that the scope of the present invention should encompass all possible parts which may be determined to approximate the theoretical loci obtained using the mathematical model in FIG. 4(b).

There can be contemplated a variety of mechanisms in which a holder 11 attached to one end A of a screen 3 is moved in unison with a squeegee 2 along a locus that enables both the snap-off angle and the screen length to be kept constant or nearly constant according to the first embodiment of the present invention.

Referring first to FIG. 5(a), the holder 11 is a freely movably disposed endless belt 111 around a first pair of pulleys 112. The screen 3 has one end A thereof secured to the belt 111. A second endless belt 114 is also freely movably disposed around a second pair of pulleys 113, and mounted to extend substantially parallel to and below the screen 3 such that the movement of the squeegee 2 with its lower end pressed against the face of the screen 2 causes the belt 114 to move by friction, since the screen is tightly pressed against the belt. Alternatively, the squeegee 2 may have its lower end connected to the belt 114 so that the belt 114 moves following the squeegee 2.

The belt 111 may be passed around a third pulley 112a that is located spaced from the axis imaginarily connected between the center of the pulleys 112 so that the belt 111 takes a curved path which may be in closer approximation with the theoretical locus determined in association with FIG. 4(a).

The belt 111 may preferably be synchronized with the belt 114 in an arrangement in which one of the pulley pairs 112 and 113 are mounted on a common shaft. With this arrangement, the movement of the screen end A secured to the belt 111 is synchronized with the squeegee 2 through the belt 114 and pulley pairs 112 and 113.

Referring then to FIG. 5(b), the holder 11 is a combination of a worm 116 or externally evenly threaded bar and an internally threaded element 115 for worm gearing engagement with the worm. The screen 3 has one end A thereof connected to the element 115 such that the screen end A is moved along the worm 116 through the element 115 as the worm 116 is itself rotated about its own axis.

The squeegee 2 has an upper end thereof connected to a second worm 119 through an internally threaded element 118 that is engaged in worm gearing about the second worm 119. It is so designed that the squeegee 2 is linearly moved by rotating the worm 119 about its own axis. The worm 119 may be rotated with a rotary bar 13. The rotational speed of worm 119 and bar 13 is proportional to that of worm 116 and holder 11. The method of making the rotational speed of worm 119 and bar 13 proportional to that of worm 116 and holder 11 may be realized by merely transmitting the rotation of worm 116 and holder 11 to worm 119 and bar 13 through cogwheels and pulleys (not shown).

Referring next to FIG. 5(c), the screen printing machine comprises a crank mechanism. The screen 3 has one end A thereof connected to a slidably movably disposed element 120a about a fixed holder 11. A crank 120 is interconnected between the element 120a and a rotary disk 121 mounted in the printing machine. The squeegee 2 has its lower end connected to a crank 122 that is secured at its opposite end to the disk 121. It is so designed that the movement of the squeegee 2 is synchronized with the element 120a and hence the screen end A through the crank mechanism comprising the cranks 120 and 122 with the disk 121.

FIGS. 6(a), 6(b) and 6(c) are modifications of the second embodiment in which both ends A and B of the screen 3 are moved in synchronization with the squeegee 2 in similar mechanism to FIGS. 5(a), 5(b) and 5(c), respectively. No further description of these modifications will be made since the screen ends A and B are moved in the substantially same manner as the screen end A in the modifications of the first embodiment. However, it is apparent that numerals 123 represent pulley pairs, 124 is a belt, 125 is an element corresponding to element 115 of FIG. 5(b), 126 is a worm, 129 is a crank, 130 is a disc and 131 is a crank.

According to each of the modifications of FIGS. 6(a), 6(b) and 6(c), the holders A and B take loci that enable not only the screen length but also the snap-off and opposite angles $\alpha$ and $\beta$ to be constant or nearly constant, with the tension developed in the screen being uniform throughout the entire travel of the squeegee 2.

It will be clear from the above that the present invention insures faithful reproduction in screen printing since the ink can be applied in an even layer of thickness over the face of the screen in the movement of the squeegee, with the resultant print having substantially no or little dimensional deviation from the original irrespective of the location in the print and enhanced uniformity in the thickness of ink transferred.

What is claimed is:

1. An improved screen printing machine comprising:
   a screen held over a surface to be printed, said screen having first and second movable ends,
   a squeegee having an inking edge at a lower end thereof and in contact with said screen for transferring ink to said screen, and
   drive means for moving said first and second ends of said screen in unison with said squeegee on said screen along loci so that:
   (a) the length of said screen is maintained substantially constant throughout said movement, and
   (b) a snap-off angle formed between the screen and the surface, on one side of the squeegee at a position opposite to the inking edge of the squeegee, is maintained substantially constant throughout the entire movement of said squeegee for ink transfer, and
   (c) an opposite angle formed between the screen and the surface, on an opposite side of the squeegee, is maintained substantially constant throughout the entire movement of said squeegee.

2. An improved screen printing machines as set forth in claim 1, wherein said drive means comprises a first drive operatively connected to the first end of said screen and a second drive operatively connected to the second end of said screen at a location opposite to said first end, said first and second drives being adapted to move said first and second ends of said screen along loci that substantially satisfy:

$$x1 - x2 = y1 \cot\alpha + y2 \cot\beta,$$

$$y1 \csc\alpha + y2 \csc\beta = L$$

respectively, where the location of said first end is (x1, y1) and that of said second end is (x2, y2) in coordinates, L is the overall length of said screen, $\alpha$ is said snap-off angle formed on the side of said first end, and $\beta$ is said opposite angle formed on the side of said second end.

3. An improved screen printing machine as set forth in claim 2, wherein said loci satisfy $$x2 = 0,$$

$$x1 \sin\alpha + y1(\cos\beta - \cos\alpha) = L\cos\alpha \cdot \cos\beta$$

respectively, where the locus followed by said first end is a straight line inclined at an angle to the direction of movement of said squeegee while the locus taken by said second end is a straight line at right angles with said direction.

4. An improved screen printing machine as set forth in claim 1, wherein said drive means comprises a first, a second and a third pulley and endless belt arrangements, said screen having a first end connected to a first endless belt driven by said first arrangement and a second end connected to a second endless belt driven by said second arrangement, said first and second arrangements being so installed that movement of said first and second endless belts causes said first and second ends to follow said loci, respectively, said squeegee being connected to a third endless belt driven by said third arrangement, said first and second arrangements being drivingly connected to said third arrangement so that movement of said first and second endless belts is synchronized with said third endless belt.

5. An improved screen printing machine as set forth in claim 1, wherein said drive means comprises a first straight elongate worm, a first element internally threaded for worm gearing engagement with said first worm, a second straight elongate worm, a second element internally threaded for worm gearing engagement with said second worm, a third elongate worm, and a third element internally threaded for worm gearing engagement with said third worm, said screen having a first end thereof connected to said first element and a second end connected to said second element, said first and second worms being so installed that movement of said elements by rotating their respective worms about their own axes moves said first and second ends long straight paths approximating said loci, respectively, said squeegee being secured to said third element so that rotation of said third worm causes said squeegee to linearly move through said third element, said first and second worms being operatively connected to said third worm so that movement of said first and second elements is synchronized with said squeegee.

6. An improved screen printing machine as set forth in claim 1, wherein said drive means comprises a first fixed bar, a first slidably disposed element about said first bar, a second fixed bar, a second slidably disposed element about said second bar, a first rotatably disposed disk, a first crank interconnected between said first disk and first element, a second rotatably disposed disk, a second crank interconnected between said second disk and second element, and a pair of third and fourth cranks interconnected between said squeegee and said first and second disks, respectively, said screen having a first end thereof secured to said first element and a second end connected to said second element, said first and second bars being so installed that movement of said first and second elements along their respective bars causes said first and second ends to follow said loci, said cranks being secured to said disks so that movement of said first and second ends is synchronized with said squeegee through said first and second elements, respectively.

* * * * *